United States Patent [19]

Miller et al.

[11] 4,211,915
[45] Jul. 8, 1980

[54] KEYBOARD VERIFICATION SYSTEM

[75] Inventors: Donald E. Miller, Waynesboro; John P. Painter, Grottoes, both of Va.

[73] Assignee: General Electric Company, Waynesboro, Va.

[21] Appl. No.: 965,852

[22] Filed: Dec. 4, 1978

[51] Int. Cl.² ............................................ G01R 31/28
[52] U.S. Cl. .................................. 371/15; 324/73 R; 340/365 R; 371/67
[58] Field of Search .............. 235/302; 340/146.1 AB, 340/365 E, 365 S, 365 C, 365 R; 364/900; 324/73 R

[56] References Cited

U.S. PATENT DOCUMENTS

| 3,659,163 | 4/1972 | Borisov et al. | 317/249 R |
| 3,675,239 | 7/1972 | Ackerman et al. | 340/365 E |
| 3,735,255 | 5/1973 | Goldman | 324/73 R |
| 3,786,497 | 1/1974 | Davis et al. | 340/365 S |
| 3,921,166 | 11/1975 | Volpe | 340/365 C |
| 3,924,181 | 12/1975 | Alderson | 324/73 R |
| 3,931,610 | 1/1976 | Marin et al. | 364/900 |
| 3,973,256 | 8/1976 | Stoesser et al. | 340/365 E |
| 4,044,244 | 8/1977 | Foreman et al. | 324/73 R |

OTHER PUBLICATIONS

Fairchild Semiconductor Ad., "If You Want Better Designs, Fewer Components", IEEE, May 1969, pp. 24-25.

Primary Examiner—Charles E. Atkinson
Attorney, Agent, or Firm—Michael Masnik

[57] ABSTRACT

A capacitive keyboard verification system is disclosed wherein key movement is verified with a high degree of accuracy in a manner largely immune to ambient noise or other electronic or electromagnetic interference. A pulse signal, in the form of a train of pulses, is periodically applied across the capacitor associated with each key. The signal coupled through the capacitor is reconstructed only if it exceeds a predetermined reference level. A test, which depends on the previously verified key state, is made to determine the existing key state. The test for the active key state is conditioned on multiple true comparisons of a reconstructed signal with the originally applied signal throughout the duration of the test. The test for the inactive key state is conditioned on the absence of a reconstructed signal throughout the test. In both instances the newly indicated key state is compared with the state to which the key is assumed to have changed from its previously verified state. If the test fails, the key is considered to have remained in its previously verified state.

Immunity to noise is enhanced by making the pulse signal a pseudo-random signal which is successively applied across the key-associated capacitors in a timing sequence out of synchronism with the generation of the pulse signal. The system disclosed avoids the requirements for massive shielding, for selective routing of conductors, or for the assignment of special, physical key locations in the electronic scanning sequence, while providing fully verified key actuation at reduced overall system cost.

33 Claims, 6 Drawing Figures

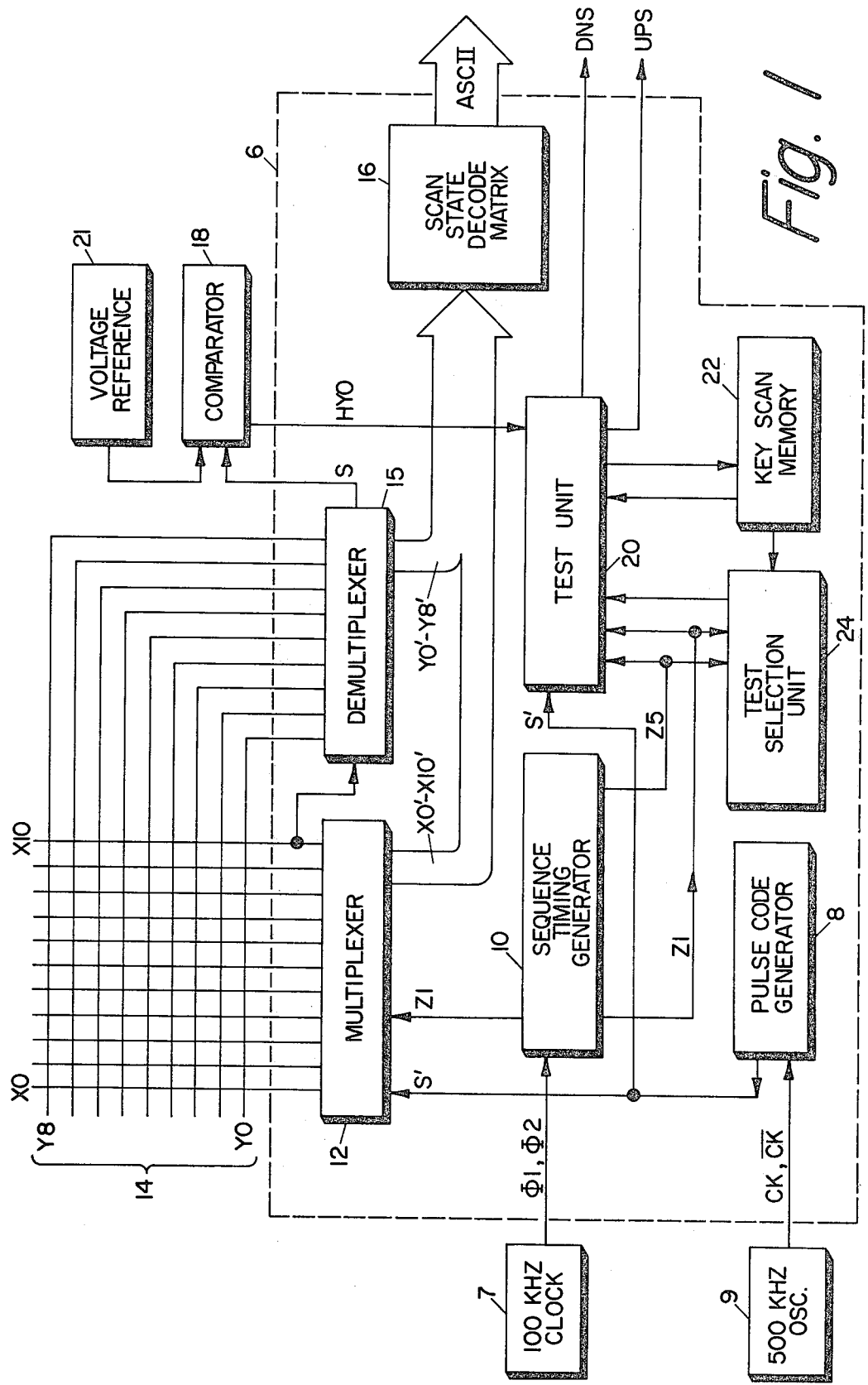

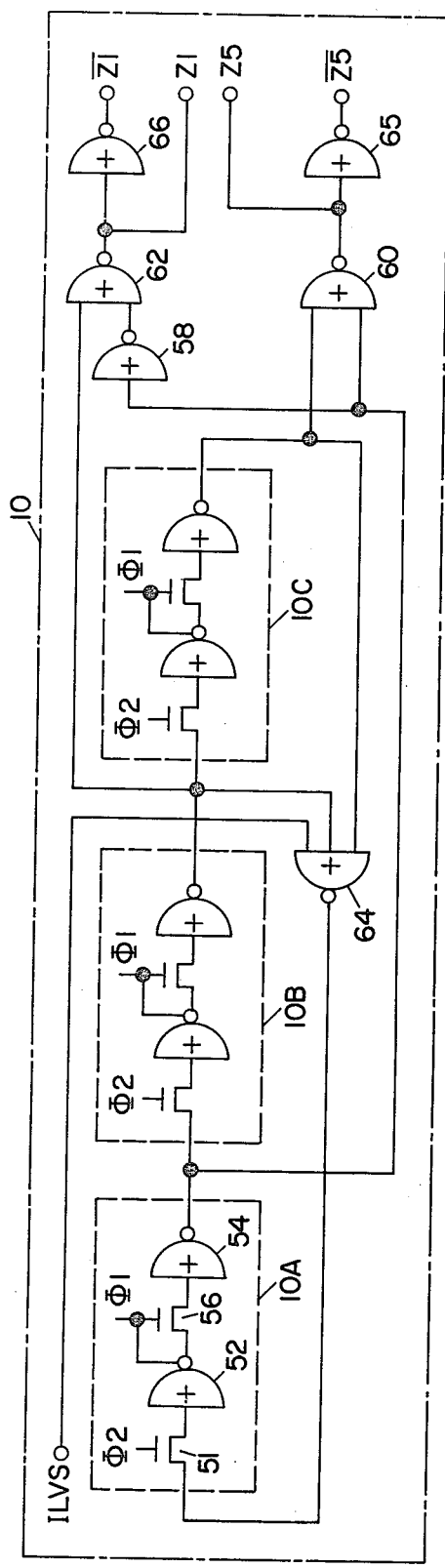
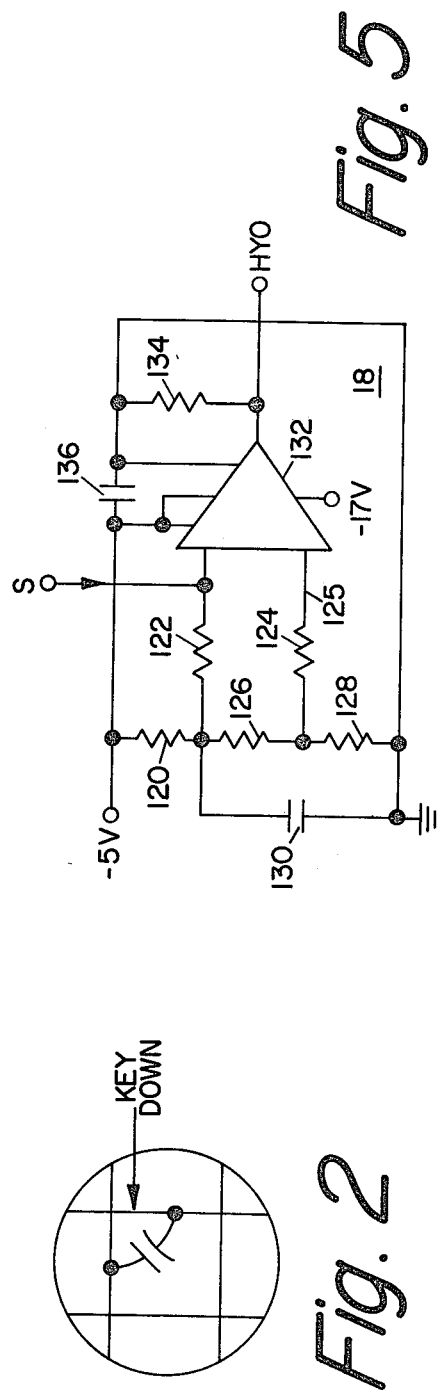
Fig. 3
Fig. 5
Fig. 2

KEYBOARD VERIFICATION SYSTEM

The present invention relates in general to a new and improved keyboard verification system, in particular to a method and system for verifying the actuation of the individual keys of a keyboard.

BACKGROUND OF THE INVENTION

Keyboards are used in a wide variety of state-of-the-art equipment as the interface between a human operator and a system, or machine, into which data, control signals, or the like are entered. Using supplementing logic circuitry, keyboards may be conveniently employed to translate keyed-in information into codes which are intelligible to the system, as for example in a data processing system with which the keyboard interfaces. Keyboards are frequently used for this purpose in the increasingly popular distributed data processing systems which employ free-standing terminals for interactive data processing.

At the present state of the data processing art, large numbers of circuits may be formed on a single semiconductor chip. Hence all signals, including keyboard-originated signals, must be provided at compatibly low amplitudes and compatibly high pulse frequencies. At these low amplitudes it is often advantageous to employ a capacitive keyboard wherein the actuation of the key changes the capacitance of a circuit rather than producing a switch closure. The increased capacitance which is provided upon key actuation supplies the necessary capacitive coupling for transmitting an applied signal through the circuit. The presence of a coupled-through signal at the output then indicates that the key was actuated, e.g. depressed to its active state.

This technique requires that the applied signal be prevented from being coupled through when the key is in its inactive state. Thus, means must be provided to detect the presence of the signal as well as its absence. In view of the fact that some capacitive coupling exists even when the key is inactive, the verification of key actuation will depend on the ability of the circuit to discriminate between two relatively small signals, rather than between the presence and absence of a signal. Hence, the signal detection means must be very sensitive and it is therefore highly susceptible to interference by ambient electromagnetic noise. When it is considered that the capacitance in the active and the inactive key states may be on the order of 40 and 20 picofarads respectively, it will be readily apparent that spurious noise signals could be interpreted as having resulted from the actuation of the key. An incorrect verification of key actuation or de-actuation, will result in the transmission of false data to the interfacing system. Such a situation is particularly likely to arise when a key is actuated for an extended period of time. For example, a key may be locked in the acutated position in order to print capital letters only. Since the key is periodically tested, the presence of noise under those conditions may be interpreted as a large number of separate key actuations.

Likewise, false data may be transmitted if there is any ambiguity concerning key actuation during the travel of the key between its active and inactive positions. Specifically, since the capacitance varies from a minimum to a maximum between these two positions, at some point during the travel of the key weak signal coupling will occur and key actuation will be verified upon testing. However, the slightest noise on the line may provide a false reading during the subsequent key test. Since these tests occur in close succession, the key may still be moving toward its active position. The problem described assumes added significance when it is considered that the operator may not fully depress a particular key, particularly when the keys are rapidly actuated in succession.

The problem of noise interference has been attacked in a number of ways in prior art keyboards, with varying degrees of success. A brute force approach calls for massive shielding to screen out noise. Noise interference has also been minimized by judiciously routing the conductors along predetermined paths and by assigning specific physical key locations in the electronic scanning sequence.

Prior art solutions to the problem of "key teasing", i.e. the ambiguity which occurs when the key is in an intermediate position, also take various forms. Snap action keyboard switches have been used which trip to the fully actuated position after being pressed to the halfway point of key travel. Another approach calls for boosting the amplitude of the coupled-through pulse signal of those keys that have been previously declared to be in the active position.

While these approaches have enjoyed some measure of success, this has been achieved at a significant cost increase and in many instances by an increase in the complexity of the keyboard. Further, such enhancement of the reliability of verification as has been obtained, has usually been limited to verifying key actuation, but not for verifying key switching to the inactive state.

OBJECTS OF THE INVENTION

Accordingly, it is an object of the present invention to provide a keyboard verification system which is not subject to the foregoing disadvantages.

It is another object of the present invention to provide a system in which the state of each key and the occurrence of a change of state can be reliably verified at all times in the presence of noise.

It is a further object of the present invention to provide a reliable keyboard verification system which is relatively simple and economical in construction.

It is a further object of the present invention to provide improved circuitry for verifying key operation in a keyboard with minimum error.

These and other objects of the invention, together with the features and advantages thereof will become apparent from the following detailed specification when considered in conjunction with the accompanying drawings in which like reference numerals indicate identical parts wherever applicable.

BRIEF DESCRIPTION OF THE DRAWINGS

FIG. 1 illustrates a preferred embodiment of the present invention in block diagram form;

FIG. 2 illustrates the nature of capacitive coupling in a capacitive keyboard matrix;

FIG. 3 illustrates a portion of the apparatus of FIG. 1 in greater detail;

FIG. 5 illustrates a preferred embodiment of a portion of the apparatus of FIG. 1.

SUMMARY OF THE INVENTION

Figure 4A:
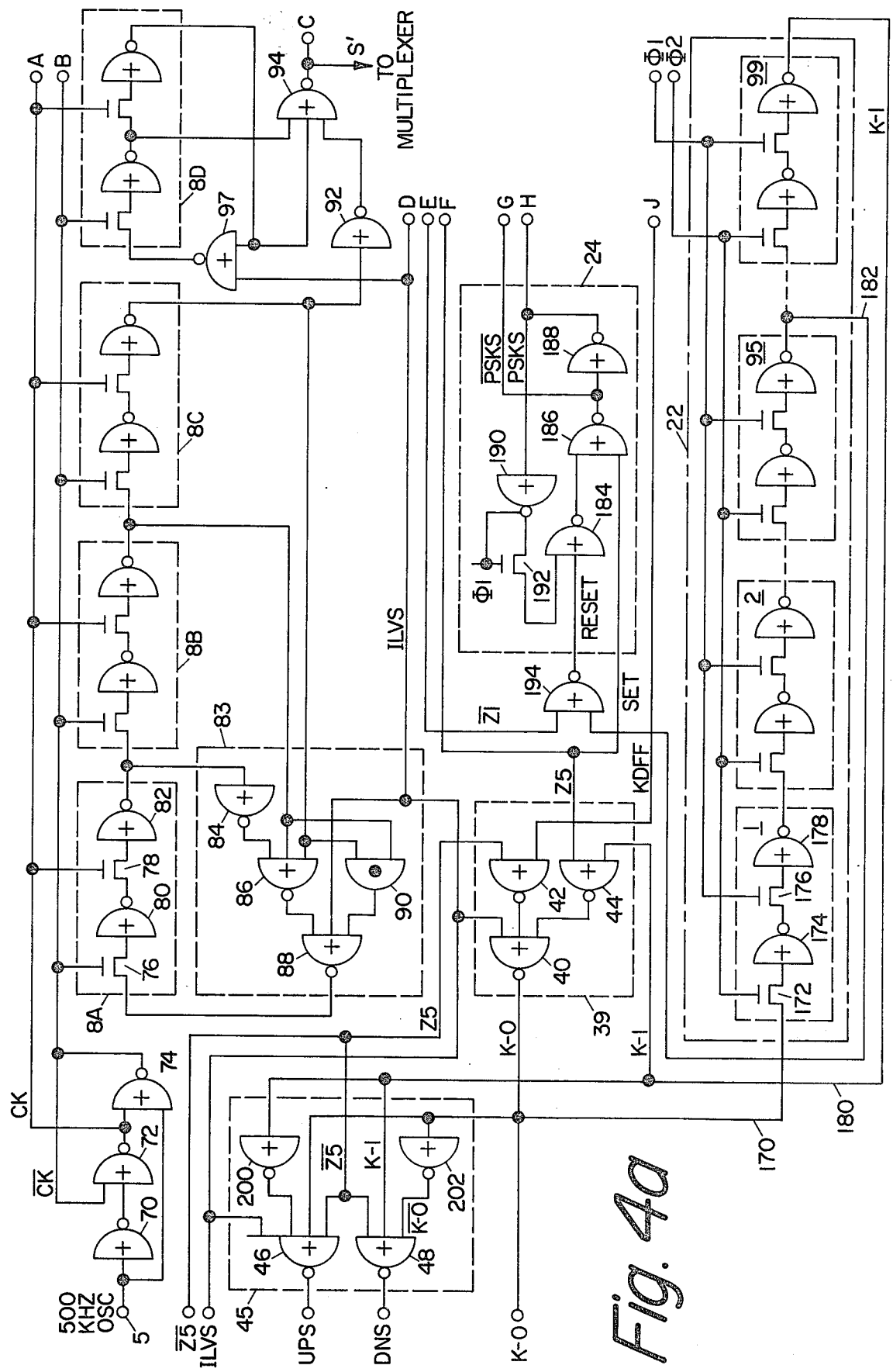
FIG. 4, consisting of FIGS. 4A and 4B, illustrates another portion of the apparatus of FIG. 1 in greater detail.

The invention herein disclosed is adapted to provide verification of a change of key state for any key of a multi-key keyboard and, collaterally, verification of the key state itself. The invention applies to any type of keyboard wherein the actuation of the selected key establishes signal coupling between at least a predetermined pair of lines of a first and a second set of signal lines, e.g. between the X and Y lines of a keyboard matrix. A pulse signal in the form of a pseudo-random pulse sequence is applied to successive X lines, while a single Y line is examined for the presence of coupled-through signals until all X lines have been pulsed. The process continues as successive Y lines are scanned until each key has been tested. Thereafter the entire procedure is repeated.

In order to avoid any portion of the applied pulse train from being repeated during key interrogation, the interrogation interval during the test of a single key is different and preferably shorter than the repetition period of the pulse sequence. Further, the application of the pseudo-random pulse sequence to the X lines is asynchronous with respect to the generation of the key test sequence, in order to differentiate the applied signal from noise by enhancing its random quality.

A selection is made of the test to be employed depending on the stored, previously verified state of the key under test and the assumption that a change of key state has occurred since. If the inactive key state was previously stored for the key under test, it is assumed that the key was actuated since the time it was last tested. Provided there is a true comparison of the applied and the reconstructed signals, a determination is made whether or not the key has changed to the active state. If the active key state was previously stored for the key under test, it is assumed the key has been inactivated since that time. In that case, the key is tested for the inactive state by observing the absence of coupled-through signals during the test. In each case, if the test is successful, the assumption concerning the change of key state is verified. If the test fails, the key is considered to have remained in its previous state. In both instances the existing state of the key is established.

DESCRIPTION OF THE INVENTION

With reference now to the drawings, FIG. 1 illustrates a preferred embodiment of the present invention in block diagram form. A number of the shown may, in actual practice, be disposed on an integrated circuit chip 6. A clock 7, which is external to chip 6, provides a 2-phase output signal $\Phi_1$ and $\Phi_2$ to a sequence timing generator 10 disposed on the chip.

An oscillator 9 is likewise external to chip 6 and is used to provide a 2-phase signal CK, CK to a pulse code generator 8 on the chip. Clock 7 and oscillator 9 operate independently of each other, i.e. out of synchronism. In a preferred embodiment of the invention, units 7 and 9 operate at frequencies of 100 KHz and 500 KHz respectively.

Reference numeral 14 designates a keyboard matrix which comprises two sets of lines, $X_0$–$X_{10}$ and $Y_0$–$Y_8$ respectively. An illustration of the physical configuration of a representative keyboard has been omitted for the sake of clarity, such devices being well-known in the art.

As used herein, the term "active" key state refers to a key position in which electrical signal coupling is established between one X line and one Y line of the matrix. When a key is actuated it is switched to its "active" position from its "inactive" position in which signal coupling is either non-existent or negligible. Key "inactivation" has the opposite meaning. In a preferred embodiment of the invention, the key is depressed when it is actuated and released when inactivated. It follows that, for such an implementation, the key is down in its active state and up in the inactive state.

While the foregoing concepts are applicable to different types of keyboards, such as for example contact types, inductive types, etc., the invention will be explained with reference to a capacitive keyboard in which capacitive coupling is established between the selected lines by actuation, for example, of a key which capacitively couples the selected lines to one another. FIG. 2 symbolically illustrates this type of coupling for a pair of lines which are uniquely selected when the corresponding key is switched to its active position.

Chip 6 further includes a multiplexer 12 which is capable of selecting one of the eleven signal lines designated $X_0$–$X_{10}$ of matrix 14. An output signal $S'$, derived from pulse code generator 8, is coupled to unit 12. Signal lines $Y_0$–$Y_8$ are coupled to a demultiplexer 15 which is adapted to select one of these lines in sequence. Lines $X_0'$–$X_{10}'$ and $Y_0'$–$Y_8'$ are illustrated as being coupled to a scan state decode matrix 16. The latter may comprise a memory in the form of a logic array adapted to provide a predetermined code, e.g. an ASCII code, in response to a predetermined X' and Y' combination.

Sequence timing generator 10 includes a pair of timing outputs Z1 and Z5 which are coupled to a test unit 20, as well as to a test selection unit 24. Although shown separately for the sake of clarity, timing output Z1 is further coupled to a multiplexer 12. A key scan memory 22 is coupled to test selection unit 24 as well as to test unit 20. The latter is also independently coupled to test selection unit 24. It will be understood that the various connections between the separate units, illustrated as single lines in FIG. 1, are not necessarily so limited and each may constitute a plurality of paths.

Demultiplexer 15 provides an output signal S which is applied to a comparator 18 external to the chip. The latter receives a further input from a voltage reference source 21. An output signal HYO is derived from comparator 18 and is coupled to test unit 20.

For reasons that will become clear from the explanation of the operation below, the testing of a single key requires a time period of 50 $\mu$sec. This period is divided into five clock pulse intervals of 10 $\mu$sec each, designated Z1, Z2, Z3, Z4 and Z5 respectively, which refer to the timing of the system. The lines designated Z1 and Z5 respectively, provide pulses during the corresponding clock pulse intervals.

FIG. 3 illustrates sequence timing generator 10 in greater detail. The generator is seen to comprise three substantially identical cells 10A, 10B and 10C respectively, each of which is timed by clock signals $\Phi_1$ and $\Phi_2$ derived from clock 7. By way of example, cell 10A comprises a switch 51 connected in series with an inverter gate 52. Switch 51 may take the form of a field effect transistor whereby the signal applied to gate 52 is timed by the $\Phi_2$ clock signal. The output of gate 52 is coupled to a second INVERTER gate 54 by way of a further switch 56 which is turned on and off by the $\Phi_1$ clock signal.

The output of gate 54 is applied to the input of cell 10B, as well as to the input of a pair of inverter gates 58 and 60 respectively. The output of gate 58 is connected to one input of a NOR gate 62 whose other input is derived from the output of cell 10B. Gate 60 receives a second input from the output of cell 10C. A NOR gate 64 receives a pair of inputs from the outputs of cells 10C and 10B respectively. A third input, designated ILVS, is used for initialization only, i.e. to clear the register at the beginning of the operation. The output of gate 64 is fed back to switch 51 which forms the input of cell 10A.

Sequence timing generator 10 essentially constitutes a shift register in which the signal propagates through all three cells in synchronism with clock signals $\Phi_1$ and $\Phi_2$. The presence of a ONE at the output of either cell 10B or 10C provides a ZERO signal at the output of gate 64 which is applied to the input of cell 10A. As a consequence, five pulse periods are defined. Timing signals $Z_1$ and $Z_5$, corresponding to the first and last pulse period respectively of the aforesaid five pulse period interval, are derived at the outputs of gates 62 and 60 respectively. The inversion of these signals to provide signals $\overline{Z_5}$ and $\overline{Z_1}$ is accomplished by inverter gates 65 and 66 respectively.

The test period for a single key of 50 u sec consists of the aforesaid five clock pulse intervals Z1, Z2, Z3, Z4 and Z5. Interval Z1 is used to set up for the test and interval Z5 for acting on the test results. The 30 μsec interval defined by $Z_2$, $Z_3$ and $Z_4$ is used for key interrogation and need not be further subdivided. Accordingly, when neither signal $Z_1$ or $Z_5$ is true, the interval Z2-Z4 is defined.

Multiplexer 12 applies signal S' in sequence to successive signal lines $X_0$–$X_{10}$. This unit may be implemented in a number of different ways, all well known in the art. In a preferred implementation a Johnson counter is used, the illustration of which has been omitted for the sake of simplicity. Similarly, demultiplexer 15 may be implemented as a Johnson counter, whereby Y0–Y8 are sensed in sequence, each for the full duration of the application of signals to all of the X lines. Since the test of a single key requires 50 μsec, the scanning of a single Y line will take 550 μsec. In a preferred embodiment a 99-keyboard is used. The scanning of the complete matrix then requires approximately 5 m sec.

FIG. 5 illustrates a preferred embodiment of comparator 18 which is shown in block diagram form in FIG. 1. A resistor-divider network, comprising resistors 120, 122, 126 and 128, is used to couple the signal S and a −5 volt reference voltage to an operational amplifier 132. A capacitor 130 is provided to shunt transient voltage peaks to ground. A resistor 134 is coupled between the amplifier output and ground. A filter capacitor 136 is connected between ground and the −5 volt reference source.

In operation, signal S, which is applied to one input of amplifier 132, is compared against a reference level applied to the other input of the amplefier. The level of the applied reference is determined by the −5 volt reference voltage and the resistor-divider network. In a practical example of the present invention, the reference level may be set at −2.5 volt against which the amplitude of the S pulses is compared. An output signal or pulse train HYO is derived at the output of amplifier 132 only if signal S exceeds the amplitude determined by the reference level. The amplitude of signal HYO is determined by the characteristics of amplifier 132 and its output circuit.

Signal S is a relatively weak signal whose amplitude is determined by the attenuation of signal S' due primarily, to the capacitance between the key-selected signal lines. In a practical embodiment of the invention, the amplitude of S' is −17 volt while signal S is approximately −0.5 volts. HYO is chosen to have an amplitude of −5 volt. Even though its amplitude is smaller than S', signal HYO represents a reconstruction of signal S'. It should be noted however, that S' is reconstructed only if the coupled-through signal S exceeds the reference level against which it is compared.

Figure 4B:
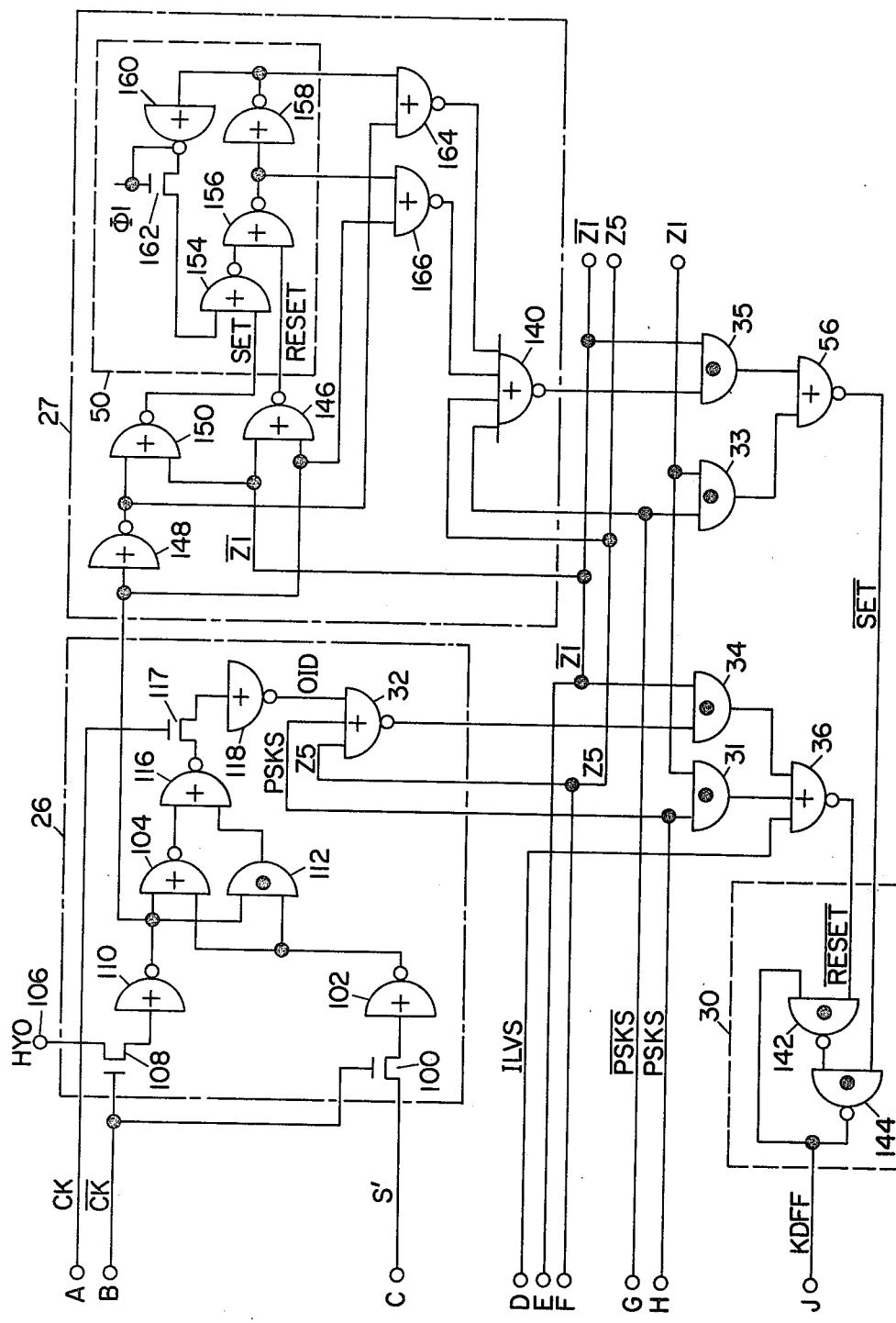

FIG. 4, which illustrates portions of the apparatus shown in FIG. 1 in greater detail, consists of FIGS. 4A and 4B in which correspondingly lettered terminals are connected to each other. An input terminal 5, which receives the 500 KHz pulse frequency output of oscillator 9, is connected to pulse code generator 8. The signal is coupled to an inverter gate 70 whose output is connected to one input of a NOR gate 72. The output of gate 72 is coupled to one input of a NOR gate 74 which receives a further input directly from terminal 5. The output of gate 74 is coupled back to a second input of gate 72.

The outputs of gates 72 and 74 are designated CK and $\overline{CK}$ respectively and supply clock pulses 180 degrees out of phase with each other, which drive the pulse code generator. The latter further comprises four cells 8A to 8D, which are substantially identical to the cells of timing sequence generator 10 illustrated in FIG. 3. By way of example, cell 8A includes first and second inverter gates 80 and 82 respectively, preceded by serially connected switches 76 and 78 respectively. The operation of switches 76 and 78 is timed by signals $\overline{CK}$ and CK respectively.

The output of cell 8A is further connected to the input of a feedback circuit 83, which includes an inverter gate 84 whose output is connected to one input of a NOR gate 86. The latter gate receives further inputs from the outputs of cells 8B and 8C respectively. The output of gate 86 is coupled to one input of a NOR gate 88 whose output in turn is connected to the input of cell 8A. The output of cells 8B and 8C are coupled to a pair of inputs of an AND gate 90, whose output is connected to a further input of gate 88. Gate 88 also receives the aforesaid ILVS signal, which is used for initializing the system as explained above.

The output of cell 8C is coupled to an inverter gate 92, the output of which is in turn coupled to one input of a NOR gate 94. Further inputs of the latter gate are derived from the outputs of cell 8D itself. Signal S' is generated at the output of gate 94. The output of cell 8D is further applied to one input of a NOR gate 97 whose output is fed back to the input of cell 8D. A further input of gate 97 receives the aforesaid ILVS signal.

Unit 8 as shown in FIG. 4A comprises 8A, 8B, 8C, 8D, 83, 97, 92 and 94 and produces a pseudo-random pulse train S'. 8A, 8B, 8C, a three stage shift register, and its feedback 83 constitute a known circuit for generating pseudo-random pulses. In accordance with the criteria set forth in a book entitled "Digital Communications" by Solomon W. Golomb, published in 1964 by Prentice-Hall, Inc., the 7-state shift register so formed fulfills the criteria for generating a pseudo-random sequence. In other words, the pulse signals which appear at the input of inverter 92 provide a pulse sequence of ZERO's and ONE's, which sequence approximates the results of flipping a perfect coin for an extended period. As such, the pulse sequence has the following properties of "randomness".

A. In each period of the sequence the number of ONE's differs from the number of ZERO's by at most 1.

B. Among the runs of ONE's and ZERO's in each period, one-half the runs of each kind are of length 1, one-fourth of each kind are of length 2, one-eighth are of length 3 and so on as long as the fractions give meaningful numbers of runs.

C. If a period of the sequence is compared term by term with any cyclic shift of itself, the number of agreements differs from the number of disagreements by at most 1.

Notwithstanding the foregoing characteristics of "randomness", the generated pulse sequence is not truly random since it is derived from a deterministic device, i.e. a shift register. Specifically, the sequence has a periodicity of 7 clock cycles. Since clock pulses CK and $\overline{CK}$ are derived from a free running 500 KHz oscillator, the generated pulse sequence available at the input to 92 will be pseudo-random in nature rather than random since it repeats at intervals of 7 clock cycles. The input to 92 constitutes a pseudo-random pulse train whose pulses occur pseudo-randomly and have a varying width. Because of the varying width, these pulses are difficult to couple across the capacitance of the keys. To overcome this, Applicants provide a circuit comprising 8D and gates 97 and 94 to provide pseudo-random pulses of constant width. The circuit comprising 8D and 97 generates two pulse trains occurrence at half the clock frequency and relatively shifted with respect to each other by 90°. These two phase shifted signals are applied as respective inputs to gate 94 along with the pseudo-random pulses from 92. 94 responds to these applied inputs to produce a pulse train S′ of uniform pulse width but pseudo-random occurrence for application to multiplexer 12.

Signal S′ is applied to multiplexer 12 as well as to test unit 20. See FIG. 1. Test unit 20 includes a key-down test circuit 26 (FIG. 4B) adapted to test for the active key state, a key-up test circuit 27 for testing for the inactive key state, a presumption selection circuit associated with each test circuit and a Presumed State flip-flop 30. The S′ signal is coupled to switch 100 which is adapted to open and close in response to clock signal $\overline{CK}$ to couple the S′ signal through inverter 102 to gates 104 and 112. The HYO signal is coupled to a switch 108, which is adapted to open and close in synchronism with clock signal $\overline{CK}$. Switch 108 is connected to an inverter gate 110 whose output is coupled to one input of a NOR gate 104, as well as to one input of an AND gate 112. The outputs of gates 104 and 112 are applied to a NOR gate 116 which, together with gates 104 and 112, forms an exclusive OR circuit for comparing signals S′ and HYO. The output of gate 116 is coupled to an inverter gate 118 by way of a switch 117 which is timed by signal CK. The output signal of gate 118 is designated ZERO-If-Different, OID.

Circuit 26 is completed by a NOR gate 32 which receives signals OID and Z5 at its inputs. A third input of gate 32 receives a signal designated Previous Scan Key State, PSKS, which is derived from the output of test selection unit 24.

A presumption selection circuit is associated with circuit 26 and comprises a pair of AND gates 31 and 34 and a NOR gate 36 which receives the outputs of gates 31 and 34 as well as the ILVS signal. The output of gate 32 is applied to one input of an AND gate 34, whose second input has timing signal $\overline{Z1}$ applied thereto. The latter signal is derived from timing sequence generator 10, illustrated in detail in FIG. 3. AND gate 31 has signal PSKS and timing signal Z1 applied to its inputs.

Key-up test circuit 27 comprises an inverter gate 148 which receives the inverted HYO signal from the output of gate 110. A pair of NOR gates 150 and 146 are coupled to the Set and Reset inputs respectively of a flip flop 50, both gates receiving a $\overline{Z1}$ signal at respective inputs thereof. Gate 146 further receives the output of gate 110, while gate 150 receives the output of gate 148. The Set input of flip flop 50 is coupled to one input of a NOR gate 154, the output of the latter gate being coupled to one input of a further NOR gate 156. Another input of gate 156 constitutes the Reset input of the flip flop. The output of gate 156 is coupled to a NOR gate 158, whose output in turn is connected to a feedback path comprising inverter gate 160 and a series-connected switch 162 which is timed by clock signal $\Phi_1$. Switch 162 is connected to a further input of gate 154. The output of gate 158 is also connected to one input of a NOR gate 164, another input of which is coupled to the output of gate 148. The output of gate 156 is connected to one input of a NOR gate 166, another input of which is coupled to the output of gate 110. The output of gates 164 and 166 form a pair of inputs of a NOR gate 140. The latter further receives timing signal Z5 and signal $\overline{PSKS}$ as inputs.

Circuit 27 has a presumption selection circuit associated therewith which comprises a pair of AND gates 33 and 35 whose respective outputs are coupled to corresponding inputs of a NOR gate 56. Gates 33 and 35 receive timing signals Z1 and $\overline{Z1}$ respectively at their inputs. An additional input of gate 35 is coupled to the output of gate 140. Gate 33 further receives the signal $\overline{PSKS}$ at its input.

The outputs of gates 56 and 36 are coupled to the $\overline{Set}$ and $\overline{Reset}$ inputs respectively of Presumed State flip flop 30. The appearance of a ZERO on one of these inputs will set or reset the circuit. Flip flop 30 comprises a pair of NAND gates 144 and 142 coupled to the $\overline{Set}$ and $\overline{Reset}$ inputs respectively. The output of gate 142 is coupled to a further input of gate 144. The output signal of gate 144 is designated KDFF and it is fed back to an input of gate 142.

Key scan memory 22 provides dynamic storage of signals representative of the state of each key of the keyboard. In a preferred embodiment of the invention the memory consists of a dynamic shift register whose 99 stages or cells, each corresponding to one key of the keyboard, are substantially identical and are connected in series with each other. For the sake of simplicity, only four cells has been illustrated in FIG. 4. Input 170 of the memory is coupled to a switch 172 in cell 1 which is series-connected with a NOR gate 174. The output of the latter gate is connected in series with a switch 176 and subsequently with an inerter gate 178. Switches 172 and 176 are pulsed by clock signals $\Phi_2$ and $\Phi_1$ respectively. Memory 22 has a pair of outputs, a "preview" output 182 which is obtained from cell 95 and the final output 180 derived from cell 99 and providing a signal which is designated K-1.

The signal derived at output 182 is applied to one input of a NOR gate 194 which receives timing signal $\overline{Z1}$ at a second input. The output of gate 194 is coupled to the Reset input of test selection unit 24. The latter comprises a flip flop wherein NOR gate 184 is connected to the aforesaid Reset input. The output of gate 184 is coupled to one input of a NOR gate 186. The other input of gate 186 constitutes the Set input of flip flop 24 and receives timing signal $\overline{Z5}$. The output of gate 186 provides the aforesaid $\overline{PSKS}$ signal which is applied to an inverter gate 188. The PSKS signal is derived at the output of gate 188 and is applied to a feedback path which connects back to another input of gate 184. The feedback path comprises an inverter gate 190 in series with a switch 192 which is timed by $\Phi_1$ pulses.

A circuit 39 comprises a NOR gate 42 which receives the aforesaid KDFF signal at one input thereof. Another input of the same gate receives the $\overline{Z_5}$ timing signal. Signal K-1 is applied to one input of a NOR gate 44, the other input receiving timing signal Z5. The outputs of gates 42 and 44 are applied to the input of a NOR gate 40, which receives initializing signal ILVS on a third input thereof. An output signal designated K-O is derived at the output of gate 40 and is coupled back to input 170 of memory 22.

An output circuit 45 includes two pairs of NOR gates, specifically inverters 200, 202, and gates 46, 48. Signal K-O is applied to one input each of gates 46 and 202, while signal K-1 is applied to one input each of gates 48 and 200. Gates 46 and 48 further receive timing signal $\overline{Z5}$ at their respective inputs, gate 46 additionally receiving initializing signal ILVS. The output signal of gate 46 is designated Up Strobe (UPS) which is provided directly to circuitry external to FIG. 4 and beyond the scope of the invention herein. The output signal of gate 48 is designated Down Strobe (DNS) and is likewise provided to external circuitry.

As previously explained, the present invention is not limited to a particular type of keyboard. A capacitive keyboard is preferably employed which comprises a matrix of small capacitors that are switches between two values of capacitance when an associated key is actuated. Every key has a unique address in the matrix, defined by one X and one Y line. The value of the capacitance at that address indicates the state of the associated key, i.e. whether the key is active or inactive.

In the operation of the present invention, the keys are tested in succession in a predetermined sequence. The test of each key determines whether or not a change of the key state has occurred and collaterally the state of the key is determined. In the discussion which follows, the active key state will be treated as the key down state which is represented by a ONE. The inactive state will be treated as the key up state which is represented by a ZERO. It will be understood however, that the invention is not limited to these definitions which are arbitrarily adopted herein.

Signal S', constituting a pseudo-random pulse train, is applied in succession to all X lines. Since clock 7 operates independently of oscillator 9, the application of signal S' is not synchronized with the occurrence of the pulses that form the pulse train of this signal. The same Y line is scanned while the application of the S' signal is sequenced through the entire complement of X lines. If the signal is coupled through to the Y line, it is an indication that the key which corresponds to a unique pair of X and Y lines has been actuated (depressed). A key that has not been depressed has insufficient associated coupling capacitance for a signal of the requisite amplitude to be coupled through. After cycling the application of the pulse signal through all X lines, the subsequent Y line is scanned in the same manner. When all Y lines have been scanned the process repeats.

The existence of spurious noise signals, or the like, may provide spurious S' pulses on the scanned Y line. Conversely, S' pulses may drop out due to incomplete signed coupling. In both instances, HYO will fail to provide a 100% reconstructed S' signal. However, whenever such a 100% reconstructed coupled-through signal is obtained, it can be stated with a high degree of certainty that a key is in fact in its down state. Nevertheless, as pointed out above, the absence of a completely reconstructed signal does not positively establish that the key is up. This uncertainty is resolved by the use of what may be called "logical hysteresis." This involves the use of separate tests for a key down and a key up determination. Thus, for each key under test, one of two separate key test procedures is selected. The selection is made on the basis of the stored results of the previous test of the key.

As explained above, it takes five clock pulses of clock 7, each having a duration of 10 $\mu$sec, to test a single key. This 50 $\mu$sec period is divided into separate time intervals. The Z1 interval, which has a duration of 10 $\mu$sec, is used to "set up" for a key test. Z2, Z3 and Z4 define a 30 $\mu$sec interval during which a key is interrogated. The Z5 interval, again 10 $\mu$sec long, is used to act on the test results. Thereafter, the test timing sequence repeats for the next key under test.

During the $Z_1$ interval, test selection unit 24 selects the proper test to be performed for a particular key. Acting on the results of the previously performed test, as stored in memory 22, Presumed State flip flop 30 is forced to a state opposite to that determined by the previous test. For purposes of the test, the key is presumed to have changed to the opposite state. For example, if the information stored in memory 22 showed that the key was up when last tested, the "key down" test would be selected and flip flop 30 would be forced to a ONE representative of the down state.

Thus, for the assumed fact situation, at time Z1 the key is presumed to be down until proven otherwise. Upon completion of the test the memory is updated if there has been a verified key state change.

It should be noted that, regardless of the type of test selected, the test itself includes a number of mini-tests. Each such mini-test within a key down test, consists of a comparison between the signal applied to the interrogated X line and the signal coupled through to the Y line which is being scanned at that time. For the key up test, each mini-test consists of a comparison of the HYO signal at time $Z_1$, with HYO during subsequent pulse periods $Z_2$–$Z_4$. In essence, a mini-test is performed during each cycle of the signal provided by oscillator 9. To test a single key requires a period of 50 $\mu$sec, extending from Z1–Z5. However, the actual key interrogation takes place in the interval Z2–Z4. Since the latter interval is 30 $\mu$sec long and each cycle of signal CK, $\overline{CK}$ is 2 $\mu$sec, the number of mini-tests performed within each key test will be approximately 15. That number may vary, however, due to the fact that units 7 and 9 operate asynchronously.

If a single mini-test fails due to circuit noise internal or external to the system, the entire key test fails, whether it is a "key down" or a "key up" test. However, because a test for a particular key state has failed does not mean that the key resides in the opposite state. In such a case it is assumed that the key has not changed states and memory updating restores the state previously stored for that key. It will thus be apparent that the present invention imposes stringent requirements for proving a key state change. Accordingly, the system may be considered as having built-in "logical hysteresis" with respect to verifying a change of key state.

In a practical embodiment of the invention each key is tested at approximately 5 m sec intervals. Therefore, if a key assumes a particular state, that state will be quickly verified even if noise should cause some tests to fail because of the failure of one or more mini-tests. Once a key is verified as being in a certain state, e.g. in the down state, the noise will not cause the key to be verified as being up.

Each test is selected with the objective of determining whether or not the key has changed its state from that stored in memory. When the last test result and the new test differ from each other, a change of key state has occurred. The memory is updated for that key state and a strobe pulse is generated.

The operation of the invention, discussed in general terms above, will become clear from the following detailed description of the tests performed. Let it be assumed that initializing signal ILVS has cleared the memory, i.e. it has set all locations to ZERO and has been subsequently removed. At Z1 time the state of the key under test, as it was found to exist when the key was last tested, is available at "preview" output 182 of memory 22. Since memory 22 provides dynamic storage, the same information will be available at output 180 at Z5 time.

The signal at memory output 182 is applied to one input of gate 194. If the up state was previously stored for the key under test, a ZERO will be applied to gate 194. Further, since the other gate input is active only at $\overline{Z1}$ time, a ZERO will appear at the other gate input. Therefore the output of gate 194 will be ONE so as to reset flip flop 24. Resetting of the flip flop causes $\overline{PSKS}$ to go to ONE and PSKS to go to ZERO. The state so assumed by flip flop 24 remains constant for the next three bit times of clock 7, i.e. for the entire interval during which the key is interrogated.

Further at time Z1, the output of gate 33 is ONE which produces a ZERO at the output of gate 56. This causes Presumed State flip flop 30 to be set. The KDFF signal, which appears at the output of gate 144, then becomes ONE as evidence of the assumption that the key has changed from a previous up state to a present down state. If KDFF is still ONE at Z5 time, the presumption of a change of key state from up to down will be proven correct.

For the sake of completeness of the discussion, it is also appropriate to examine the $\overline{Reset}$ input of flip flop 30 at time Z1. Gate 31 receives a signal PSKS at one of its inputs. Since this signal is a ZERO at Z1 time, as explained above, the output of gate 31 will be ZERO. Likewise, the output of gate 34 will be ZERO at Z1 time. Hence a ONE appears at the output of gate 36 which fails to reset flip flop 30 when applied to the $\overline{Reset}$ input of the latter.

It should be noted that signal PSKS remains ONE for 5 bit times and will force a ZERO output at gate 140 for the duration of the key test. Gate 35 therefore remains blocked for the same period. Further, PSKS is ZERO under these conditions and Z5 is also ZERO at Z1 time. However, as long as the comparison of S' and HYO remains true, the OID signal is ONE and the output of gate 32 will be ZERO. All inputs of gate 36 are therefore ZERO and hence a ONE signal is applied to the $\overline{Reset}$ input of flip flop 30. This condition is consistent with the set state of the flip flop. If maintained until Z5 time, it verifies that the key has been depressed.

Once the "key down" test has been selected, any ZERO appearing on the OID output of gate 118 during the Z2, Z3 or Z4 intervals due to noise or the like, will reset the Presumed State flip-flop 30. During the Z1 interval this action is prevented from occurring by the application of the $\overline{Z1}$ signal to gate 34. It should be noted that once flip flop 30 is reset due to noise or the like, the presumption that the key changed to the down state is cancelled. No further change of flip flop 30 is possible until such time as the subsequent key comes under test, i.e. during the subsequent Z1 interval.

Switch 100 in circuit 26 is switched on and off by CK at a frequency of 500 KHz. This has the effect of opening and closing a window at that frequency which allows signal S' to be applied to gate 102. This is the signal which drives the selected X line with the pseudo-random pulse train provided at the output of pulse code generator 8. Concurrently with the operation of switch 100, reconstructed signal HYO is applied to gate 110 through the window determined by the opening and closing of switch 108. If a key was actuated and a key closure was made, and in the absence of extraneously introduced noise, S' and HYO should always present identical waveforms, i.e. ONE's and ZERO's should occur in synchronism.

Whenever clock pulse $\overline{CK}$ goes low, both windows are closed and the then existing states of signals HYO and S' respectively are "trapped," i.e. they are temporarily stored. This permits a comparison of these signals to be made by the EXCLUSIVE OR circuit formed by gates 104, 112, 116 and 118. If the output signals of gates 102 and 110 are both ONE, then the output of gate 112 will be ONE. This will appear as a ONE at the output of gate 118 for application to the connected input of gate 32. If the outputs of gates 102 and 110 are both ZERO, then the output of gate 104 will be ONE, which will again provide a ONE at the output of gate 118. Thus, a ONE will appear at the output of gate 118 only if both S' and HYO are in the same state. It should be noted that when both windows are closed, i.e. when clock pulse $\overline{CK}$ is low, switch 117 is opened by clock pulse CK and allows a comparison of the "trapped" states. Therefore, while the windows are closed, the OID signal at the output of gate 118 will be ONE if S' and HYO are in the same state.

If the states of signals S' and HYO are different during a mini-test, the outputs of gates 104 and 112 will both be ZERO. The CK pulse will then cause a ZERO to appear at the output of gate 118. Accordingly, the OID signal is ZERO whenever S' and HYO do not agree. In the latter case, the output of gate 32 becomes ONE and hence gate 34 is turned on at the conclusion of the Z1 interval. The resultant ONE signal, applied to gate 36, will produce a ZERO at the output of the latter. This will reset flip flop 30 and cancel the presumption that the interrogated key was down.

The interrogation interval lasts from Z2-Z4. Thereafter the Z5 interval is used to act on the test results, as previously explained. At Z5 time, the outputs of gates 32 and 140 are both forced to ZERO by the presence of the Z5 signal. This blocks the respective signal paths to Presumed State flip flop 30 which these gates control. Likewise, gates 31 and 33 are blocked by the presence of a ZERO on their respective Z1 inputs at Z5 time. Accordingly, under the assumed operating conditions flip flop 30 remains undisturbed and provides a ONE at its output at Z5 time.

As explained above, if the presumed key state which was established at the output of flip flop 30 at Z1 time is still present at Z5 time, then the presumption regarding the state to which the key has changed is proven to be correct. In the example under consideration, the output of flip flop 30 was ONE at Z1 time as well as at Z5 time. Hence, the presumption that the interrogated key was down is shown to be correct.

In circuit 39, gates 42 and 44 complement each other in providing a signal path to output gate 40. Prior to Z5 time, gate 44 is open to permit memory output signal K-1 to be recirculated to memory input 170 in the form of signal K-0. At Z5 time gate 44 closes to block the feedback path and gate 42 opens to permit signal KDFF to be applied to gate 40. Under the assumed operating conditions KDFF is ONE and hence signal K-0 will also be ONE. Therefore, the now-verified "down" state of the key under test is applied to memory input 170 and is stored in memory as a ONE signal to replace the ZERO previously stored at the same memory location.

It will be remembered that a key test takes five clock pulses of clock 7. However, the dynamic memory 22 illustrated herein shifts on the occurrence of each such clock pulse. Therefore the results of successive key tests are stored in every fifth memory location. It will be noted that "preview" output 182 precedes final memory output 180 by five memory locations. Accordingly, the memory contents available at output 182 at Z1 time are available at output 180 at Z5 time.

In the present example signal K-1 was ZERO at the initiation of the test described above, indicative of the fact that the key was up when previously tested. The code for this particular key is generated by unit 16 in FIG. 1 whenever the key is scanned. The code will be valid to the outside world only if the key was verified to have been pressed down since the time it was last tested. Therefore, a down strobe (DNS) is required to validate the key code to the outside world. The generation of such a signal is implemented by output logic circuit 45. The K-0 signal is inverted by gate 202 and is applied as a ZERO to one input of gate 48. Another input of the same gate receives signal K-1. In the example under consideration, this signal is ZERO (key up) in conformance with the previously stored test results. At Z5 time the Z5 input of gate 48 also becomes ZERO and a DNS signal is generated. Simultaneously the UPS signal will be ZERO due to the action of gates 200 and 46, indicative of the fact that the change of key state was not due to an up stroke.

One further action which takes place at Z5 time must be noted. The Z5 signal acts to set flip flop 24. During the subsequent Z1 interval, i.e. the Z1 interval of the test period during which the subsequent key is tested, the $\overline{Z1}$ signal applies a ZERO to gate 194. If the signal provided by memory "preview" at output 182 is ZERO at this time, (as it was at the beginning of the test described above), the output of gate 194 will be ONE and flip flop 24 will be reset. If memory "preview" is ONE flip flop 24 will remain set. The latter operation will occur when the key, which was found by the test described above to be in the down state, is re-tested.

It will be clear from the foregoing explanation that circuit 26 acts to check the presumption that a key has gone down, as established by presumption selection circuit 31, 34, 36 and by flip flop 30. This test is performed on the basis of the up state stored for the key during its previous interrogation. The presumption can be proven invalid for one or both of two reasons:

a. The key has not been depressed since it was last tested and found to be in its "up" state;

b. One or more mini-tests failed during the interrogation period so as to provide an OID signal which is ZERO at the output of gate 118.

If either or both of these events occur, the presumption that the key was depressed since the last test is cancelled and the state of the key stored in memory remains the same. For the situation discussed, a UPS signal will not be generated. Subsequent tests of the same key occur at approximately 5 m sec intervals.

As previously explained, the failure to generate a down strobe signal does not establish with certainty that a key has either gone up or that it has remained in its up state. That condition must be proved positively by a test which is implemented by circuit 27 in FIG. 4. Let it be assumed that it is Z1 time and the "preview" output 182 at memory cell 95 provides a ONE, indicative of the key down state when the particular key was previously tested. A ONE is applied to the connected input of gate 194 and flip flop 24 is not reset. Flip flop output signal PSKS remains ONE and acts to block the key down test at gate 32, while enabling gate 31. This action produces a ZERO at the output of gate 36 to reset flip flop 30. The resultant ZERO output is indicative of the presumption that the state of the key has changed from down to up.

As before, the state of flip flop 24 remains constant from Z1-Z4. In the present example, this means that the flip flop remains in its set state so that PSKS and $\overline{PSKS}$ will remain ONE and ZERO respectively.

The HYO signal is coupled to one input each of gates 150 and 146 respectively, to the former by way of gates 110 and 148, to the latter by way of gate 110 only. Gates 150 and 146 are enabled only at Z1 time, during which signal HYO is latched into flip flop 50. If HYO is ONE at Z1 time, the output of gate 146 will be ONE and flip flop 50 is reset. This will force the output of gate 158 to a ONE and the output of gate 156 to a ZERO. As a consequence gate 164 will be blocked and gate 166 enabled. Conversely, if HYO is ZERO at Z1 time, flip flop 50 is set and gate 166 will be blocked while gate 164 is enabled. Thus, one or the other of gates 164 and 166 is selected, depending on the state of the HYO signal at time Z1.

At the conclusion of the Z1 interval, gate 35 is enabled. At this time all the inputs of gate 140 are at ZERO, except one input derived from either gate 164 or 166, as explained above. Should all the inputs of gate 140 become ZERO during interrogation interval Z2-Z4, as would happen if the state of signal HYO were to change during this interval, a ONE signal will appear at the output of gate 140 causing Presumed State flip flop to be set and thereby cancel the key up presumption. Therefore in the key up test, throughout interrogation interval Z2-Z4, the state of the HYO signal is compared by circuit 27 to the state of HYO which was latched into flip flop 50 at time Z1. If there is a difference, the key up test fails and the key up presumption is cancelled. It will be apparent that the key up test sets very stringent conditions, since no coupled-through pulses, whether due to key actuation or to noise are allowed.

In the example under consideration the outputs of gates 32 and 140 both become ZERO at Z5 time, so that the key up test as well as the key down test are blocked. Thus, no paths are left open that could switch Presumed State flip flop 30, which now stores the verified state of the tested key. Assuming the key up test was successful, a ZERO will appear at the output of this flip flop. In the manner explained above, at time Z5 gate 44 in circuit 39 is disabled so as to block the recirculation path of memory 22. Gate 42 is opened and signal KDFF from the output of flip flop 30 is admitted. The resultant K-0 signal, which is ZERO in this case, is fed back into memory during this interval by way of gates 40 and memory input 170.

In the example under consideration, the previous key state was down and hence a ONE is derived from output 180 of memory 22 at time Z5. The latter signal is inverted by gate 200 and is applied to gate 46 as a ZERO. Since the key up state has been verified, signal K-0 will be ZERO, as will the $\overline{Z5}$ input at Z5 time. Accordingly an up strobe (UPS) will be generated at the output of gate 46.

From the foregoing discussion, it will be apparent that the present invention provides a novel system for verifying the actuation of the keys of a keyboard wherein the previously verified state of each key is used as a basis for selecting the test with which the new state is verified. The tests provided are stringent, using a series of mini-tests each capable of producing failure of the overall test. Further, in order to distinguish the signal coupled through as a result of key actuation from extraneous noise, a random pulse sequence is employed to energize the various signal lines in a manner whereby the generation of the pulse sequence and the application thereof to the signal lines occur out of synchronism with each other.

The present invention is not limited to the specific embodiment illustrated and described herein and various changes may be made without departing from the basic concepts and principles of the invention. For example, the invention is not limited to a capacitive keyboard matrix and is applicable to any type of system wherein the actuation of a key results in coupling an applied signal through to a sensing means. It will also be clear that the signal lines need not be arranged in matrix form, the sole requirement being that a unique combination of lines be selected from different sets of lines by the actuation of the selected key.

While the term key actuation has been used in the sense of the down position of the key representing the active state and the up position the inactive state, the invention is not so limited. Any key position, whether up, down, left or right may be chosen to represent the active key state, provided of course that the key selects a unique combination of lines in that position. Similarly, while the convention has been used herein that a ONE represents the active key state and ZERO represents the inactive state, the invention is not so limited.

The use of a pseudo-random pulse signal confers important advantages not present in prior art devices of this kind. It will be clear, however, that the use of other types of pulse sequences are possible. Likewise, the application of pulse signals to the signal lines need not occur out of synchronism with the generation of the signals, although such an arrangement likewise confers important advantages to the present invention with respect to noise immunity. It is further pointed out that the selection of the test to be employed, based on the results of the previous test of the key presently under interrogation, by itself provides important advantages which are absent from prior art verification systems. These advantages are further enhanced by the use of mini-tests.

From the foregoing discussion, it will be apparent that numerous modifications, variations, substitutions and changes will now occur to those skilled in the art all of which fall within the spirit and scope contemplated by the present invention. Accordingly, it is intended that the invention be limited only by the scope of the appended claims.

What we claim as new and desire to secure by Letters Patent of the United States is:

1. A system for verifying the actuation of the individual keys of a keyboard wherein signal coupling between selected lines of at least a first and a second set of signal lines is established when a corresponding selected key changes from its inactive to its active state;
    said system comprising:
    means for applying first and second clock signals;
    a pulse signal generator controlled by said first clock signal;
    means controlled by said second clock signal for periodically applying said pulse signal to respective ones of said first set of lines in succession;
    means controlled by said second clock signal for periodically scanning respective ones of said second set of lines in succession, the scan duration for each of said second lines being substantially coextensive with the successive application of said pulse signal to all of said first lines, each of said scans being adapted to sense signals coupled through to said scanned second line from any of said first lines indicative of the active state of the corresponding keys;
    memory means for storing signals representative of the state of each key;
    first and second test means timed by said second clock signal and responsive to said sensed signal for determining the state of the key under test;
    means responsive to the previously stored state of said key for selecting one of said test means;
    means responsive to the selected test means and to said previously stored key state for generating an output signal indicative of the newly verified state of said key; and
    means responsive to said output signal for updating said previously stored key state in said memory means.

2. A system in accordance with claim 1 wherein said selection means is connected to the output of each of said test means adapted to block signals from the non-selected test means;
    said first test means including first comparing means for effectively comparing each signal applied to one of said first lines with a signal representative of the sensed coupled-through signal to provide a comparison signal;
    said system further comprising means connected between said selection means and said output signal generating means for providing a signal representative of a presumed key state opposite to that previously stored for the key under test; and
    means responsive to the occurrence of a false comparison signal for switching said presumed key state signal to represent said previously stored key state.

3. A system in accordance with claim 2 wherein said updating means comprises means for recirculating said output signal to the input of said memory means; and
    means responsive to said output signal and to the previously stored key state of the key under test for generating a strobe signal in response to a change of key state, said strobe signal being indicative of the direction of said key state change.

4. A system in accordance with claim 3 and further including second comparing means adapted to reconstruct said sensed coupled-through signal if the latter exceeds a predetermined reference voltage; and means for coupling the signal so reconstructed to said first comparing means for comparison with said applied pulse signal.

5. A system in accordance with claim 4 wherein the interval for testing the state of individual keys is defined by a predetermined number of clock pulses of said second clock signal;

said second test means comprising means for comparing the state of said reconstructed signal during the first clock period of said test interval with the state of the same signal during subsequent clock periods of said test interval to determine the absence of coupled-through pulses during said test interval.

6. A system in accordance with claim 1 wherein said pulse signal generator is adapted to provide a pseudo-random pulse signal for application to said first set of lines.

7. A system in accordance with claim 6 wherein said first and second clock signals are asynchronous with respect to each other.

8. A system for verifying the actuation of the individual keys of a keyboard wherein signal coupling between selected lines of at least a first and a second set of signal lines is established when a corresponding selected key changes from its inactive to its active state;

said system comprising:

means for applying first and second clock signals;

a pulse signal generator adapted to provide a pseudo-random pulse sequence in synchronism with said first clock signal;

means controlled by said second clock signal for periodically applying diverse pulse trains of said pseudo-random pulse sequence to respective ones of said first set of lines in succession;

means controlled by said second clock signal for periodically scanning respective ones of said second set of lines in succession, the scan duration for each of said second lines being substantially coextensive with the successive application of said pulse trains to all of said first lines, each of said scans being adapted to sense pulse trains coupled through to said scanned second line from any of said first lines indicative of the active state of the corresponding keys;

memory means for storing signals representative of the state of each key;

means for comparing each pulse of a sensed coupled-through pulse train against a reference voltage, said comparing means including means for generating a reconstructed pulse for each sensed pulse which exceeds said reference voltage to generate a reconstructed pulse train corresponding to said sensed pulse train;

test means timed by said second clock signal for determining the state of the key under test, said test means comprising means for comparing each of said reconstructed pulse trains to its corresponding applied pulse train to provide a comparison signal;

means responsive to said comparison signal and to said previously stored key state for generating an output signal indicative of the newly verified state of said key; and means responsive to said output signal for updating said previously stored key state in said memory means.

9. A system in accordance with claim 8 wherein said first and second clock signals are asynchronous with respect to each other.

10. A system in accordance with claim 9 wherein said first and second clock signals have frequencies $f_1$ and $f_2$ respectively, where $f_1 >> f_2$.

11. A system in accordance with claim 10 wherein the interval for testing the state of individual keys is defined by a predetermined number of clock pulses of said second clock signal and a signal sensing interval of duration $T_s$ is defined by said clock pulses within said key test interval;

said pseudo-random pulse sequence having a sequence repetition period $T_r$, where $T_r > T_s >> 1/f_1$.

12. A system for verifying the actuation of the individual keys of a keyboard wherein capacitive signal coupling between selected lines of a first and a second set of signal lines is established when a corresponding selected key changes from its inactive to its active state;

said system comprising:

means for applying first and second asynchronous clock signals;

a pulse signal generator adapted to provide a pseudo-random pulse sequence in synchronism with said first clock signal;

multiplexing means controlled by said second clock signal for periodically applying diverse trains of pulses of said pulse sequence to respective ones of said first set of lines in succession;

demultiplexing means controlled by said second clock signal for periodically scanning respective ones of said second set of lines in succession, the scan duration for each of said second lines being substantially coextensive with the successive application of said pulse trains to all of said first lines, each of said scans being adapted to sense pulse trains coupled through to said scanned second line from any of said first lines indicative of the active state of the corresponding keys;

memory means for storing signals representative of the state of each key;

means for comparing each pulse of a sensed coupled-through pulse train against a reference voltage, said comparing means including means for generating a reconstructed pulse for each sensed pulse which exceeds said reference voltage to generate a reconstructed pulse train corresponding to said sensed pulse train;

first and second test circuits timed by said second clock signal for determining the active or inactive state respectively of the key under test;

said first test circuit comprising means for comparing each of said reconstructed pulse trains with its corresponding applied pulse train during each cycle of said second clock signal, said comparing means being adapted to provide a true comparison signal for the key under test only while coincidence of the compared pulses is maintained;

said second test circuit comprising means for determining the occurrence of reconstructed pulses during the test interval for said key;

a first bistable circuit connected to said memory means and adapted to provide a signal representative of the previously stored state of the key under test;

first and second selection means connected to the output of said first and second test circuits respectively, each of said selection means being responsive to said previously stored key state signal to select one of said test circuits by blocking the output of the non-selected circuit;

a second bistable circuit coupled to said first and second selection means adapted to provide a signal representative of a presumed key state opposite to that previously stored for said key, said second bistable circuit being responsive to a false comparison signal from said second-recited comparing means for switching from said presumed key state to said previously stored key state;

means responsive to said memory means and to said second bistable circuit for providing an output signal indicative of the newly verified state of said key;

means for recirculating said output signal to the input of said memory means to update the key state previously stored for said key; and means responsive to said output signal and to said previously stored key state of said key for generating a strobe signal in response to a change of key state, said strobe signal being indicative of the direction of key state change.

13. A system in accordance with claim 12 wherein the interval for testing the state of individual keys is defined by a predetermined number of clock pulses of said second clock signal;

said second test means comprising means for comparing the state of said reconstructed signal during the first clock period of said test interval with the state of the same signal during subsequent clock periods of said test interval to determine the absence of coupled-through pulses during said test interval.

14. A system in accordance with claim 13 wherein said first and second clock signals have frequencies $f_1$ and $f_2$ respectively, where $f_1 > > f_2$.

15. A system in accordance with claim 14 wherein signal sensing during each of said key test intervals is limited to a shorter interval $T_s$ defined by a predetermined number of clock pulses of said second clock signal;

said pseudo-random pulse sequence having a sequence repetition period $T_r$, where $T_r > T_s > > 1/f_1$.

16. A method for verifying the actuation of individual keys of a keyboard wherein signal coupling between selected lines of at least a first and a second set of signal lines is established when a corresponding selected key changes from its inactive to its active state;

said method comprising the steps of:

generating a pulse signal in synchronism with a first clock signal having a frequency $f_1$, said pulse signal comprising a pseudo-random pulse sequence having a repetition period $T_r$;

periodically applying said pulse signal in succession to respective ones of said first set of lines in synchronism with a second clock signal having a frequency $f_2$, said signal application energizing said first lines with pulse trains constituting diverse portions of said pulse sequence;

periodically scanning respective ones of said second set of lines in succession in synchronism with said second clock signal, the scan duration for each of said second lines being substantially coextensive with the successive application of said pulse trains to all of said first lines, each of said scans being adapted to sense pulse trains coupled through to the scanned second line from any of said first lines indicative of the active state of the corresponding keys;

storing signals representative of the state of each of said keys; verifying the existing state of the key under test through a test selected in dependence on the previously stored key state signal;

generating an output signal representative of said existing key state;

comparing the previously stored key state signal with said output signal to generate a strobe signal upon the occurrence of a change of key state, said strobe signal being indicative of the direction of said key state change; and updating said previously stored key state signal with said output signal.

17. The method of claim 16 wherein $f_1 > > f_2$.

18. The method of claim 17 and further including the steps of;

comparing each pulse of the pulse train sensed for the key under test with a reference voltage;

reconstructing each sensed pulse if it exceeds said reference voltage to generate a reconstructed pulse train;

said step of verifying said existing key state including the steps of comparing said reconstructed pulse train with its corresponding applied pulse train if the inactive key state was previously stored for said key; and determining the absence of coupled-through pulses if the active key state was previously stored for said key.

19. The method of claim 18 wherein the comparison of said pulse trains for the key under test has a duration $T_s$, where $T_r > T_s > > 1/f_1$.

20. The method of claim 19 and further comprising the steps of generating a presumed key state signal indicative of a key state opposite to that represented by said previously stored key state signal for said key under test; and switching the state of said presumed key state signal to said previously stored key state upon the occurrence of a false comparison of said compared pulse trains, said presumed key state signal determining the state of said output signal.

21. A system for verifying the actuation of the individual keys of a keyboard wherein signal coupling between selected lines of at least a first and a second set of signal lines is established when a corresponding selected key changes from its inactive to its active state;

said system comprising:

a pulse signal generator;

means for periodically applying the pulse signal from said generator to respective ones of said first set of lines in succession;

means for periodically scanning respective ones of said second set of lines in succession, the scan duration for each of said second lines being sufficient to permit the sensing of signals coupled through to said scanned second line from any of said first lines indicative of the active state of the corresponding keys;

memory means for storing signals representative of the past state of each key;

first and second different test means responsive to a sensed signal for determining the state of the key under test;

means responsive to the previously stored state of said key for selecting one of said test means;

means responsive to the selected test means and to said sensed signal for generating an output signal indicative of the newly verified state of each key; and means responsive to said output signal for updating said previously stored key state in said memory means.

22. A system in accordance with claim 21 wherein said pulse signal generator is adapted to provide a pseudo-random pulse signal for application to said first set of lines;

said first test means including first comparing means for effectively comparing each signal applied to one of said first lines with a signal representative of the sensed coupled-through signal to provide a comparison signal;

said system further comprising means responsive to said test means for providing a signal to said output signal generating means representative of a presumed key state opposite to that previously stored for the key under test; and means responsive to the occurrence of a false comparison signal for switching said presumed key state signal to represent said previously stored key state.

23. A system in accordance with claim 22 and further including second comparing means adapted to reconstruct said sensed coupled-through signal if the latter exceeds a predetermined reference voltage; and means for coupling the signal so reconstructed to said first comparing means for comparison with said applied pulse signal.

24. A system for verifying the actuation of the individual keys of a keyboard wherein signal coupling between selected lines of at least a first and a second set of signal lines is established when a corresponding selected key changes from its inactive to its active state;

said system comprising:

a pulse signal generator for providing pulse signals in a sequence having a pseudo-random nature;

means for periodically applying said pulse signals to respective ones of said first set of lines in succession;

means for periodically scanning respective ones of said second set of lines in succession, each of said scans being adapted to sense signals coupled through to said scanned second line from any of said first lines indicative of the active state of the corresponding keys;

memory means for storing signals representative of the state of each key;

first and second test means responsive to said sensed signal for determining the state of the key under test;

means responsive to the previously stored state of said key for selecting one of said test means; and means responsive to the selected test means and to said previously stored key state for generating an output signal indicative of the newly verified state of each key.

25. An arrangement according to claim 24 further comprising means responsive to said output signal for updating said previously stored key state in said memory means.

26. An arrangement according to claim 24 wherein the means for scanning scans at a rate which is different than the repetition rate of the pulse sequence of pulse signals from said pulse signal generator.

27. An arrangement according to claim 26 wherein said scanning rate is greater than said repetition rate.

28. A system in accordance with claim 24 wherein said selection means is connected to the output of each of said test means adapted to block signals from the non-selected test means;

said first test means including first comparing means for effectively comparing each signal applied to one of said first lines with a signal representative of the sensed coupled-through signal to provide a comparison signal;

said system further comprising means connected between said selection means and said output signal generating means for providing a signal representative of a presumed key state opposite to that previously stored for the key under test; and means responsive to the occurrence of a false comparison signal for switching said presumed key state signal to represent said previously stored key state.

29. A system in accordance with claim 28 wherein said updating means comprises means for recirculating said output signal to the input of said memory means; and means responsive to said output signal and to the previously stored key state of the key under test for generating a strobe signal in response to a change of key state, said strobe signal being indicative of the direction of said key state change.

30. A system in accordance with claim 29 and further including second comparing means adapted to reconstruct said sensed coupled-through signal if the latter exceeds predetermined reference voltage; and means for coupling the signal so reconstructed to said first comparing means for comparison with said applied pulse signal.

31. A system for verifying the actuation of the individual keys of a keyboard wherein signal coupling between selected lines of at least a first and a second set of signal lines is established when a corresponding selected key changes from its inactive to its active state;

said system comprising:

a pseudo-random pulse signal generator adapted to provide a pseudo-random pulse sequence;

means for periodically applying diverse pulse trains of said pseudo-random pulse sequence to respective ones of said first set of lines in succession;

means for periodically scanning respective ones of said second set of lines in succession, each of said scans being adapted to sense pulse trains coupled through to said scanned line from any of said first lines indicative of the active state of the corresponding keys;

memory means for storing signals representative of the state of each key;

means for comparing each pulse of a sensed coupled-through pulse train against a reference voltage, said comparing means including means for generating a reconstructed pulse for each sensed pulse which exceeds said reference voltage to generate a reconstructed pulse train corresponding to said sensed pulse train;

test means for determining the state of the key under test, said test means comprising means for comparing each of said reconstructed pulse trains to its corresponding applied pulse train to provide a comparison signal; and means responsive to said comparison signal and to said previously stored key state for generating an output signal indicative of the newly verified state of said key.

32. An arrangement according to claim 31 further comprising means responsive to said output signal for updating said previously stored stored key state in said memory means.

33. A system in accordance with claim 31 wherein said first and second signals are asynchronous with respect to each other.

* * * * *

UNITED STATES PATENT OFFICE
CERTIFICATE OF CORRECTION

Patent No. 4,211,915  Dated  July 8, 1980

Inventor(s) Donald E. Miller et al

It is certified that error appears in the above-identified patent and that said Letters Patent are hereby corrected as shown below:

Column 3, line 55, cancel "CK" (second occurrence) and
    insert -- $\overline{CK}$ --
Column 11, line 57, cancel "PSKS" and insert -- $\overline{PSKS}$ --
Column 12, line 12, cancel "CK" and insert -- $\overline{CK}$ --

*Signed and Sealed this*

*Twenty-first* Day of *July 1981*

[SEAL]

Attest:

Attesting Officer

GERALD J. MOSSINGHOFF

*Commissioner of Patents and Trademarks*